United States Patent [19]

Lay et al.

[11] Patent Number: 4,841,162
[45] Date of Patent: Jun. 20, 1989

[54] LIMITER SWITCHING APPARATUS

[76] Inventors: Bor-Cherng Lay, No. 156, Ta-Tun 1st St.; Shoei-Sheng Jou, No. 12, Alley 5, Lane 500, Wu-Chyuan Rd., both of Taichung, Taiwan

[21] Appl. No.: 219,002

[22] Filed: Jul. 14, 1988

[51] Int. Cl.$^4$ .............................................. H03K 19/12
[52] U.S. Cl. .................................... 307/112; 307/140; 307/116; 307/115
[58] Field of Search ............... 307/112, 147, 148, 149, 307/129, 130, 38, 34, 35, 37, 39, 40, 41, 140; 361/13, 91, 58, 135, 426, 395; 335/16, 147; 200/151

[56] References Cited

U.S. PATENT DOCUMENTS

| | | | |
|---|---|---|---|
| 3,693,060 | 9/1972 | Joyce | 307/117 X |
| 3,886,376 | 5/1975 | Asija | 307/116 |
| 4,007,378 | 2/1977 | Lazzara | 307/112 |
| 4,370,564 | 1/1983 | Matsushita | 307/140 |
| 4,480,195 | 10/1984 | Sawaki et al. | 307/140 |
| 4,525,634 | 6/1985 | Southard | 307/140 X |
| 4,591,731 | 5/1986 | Garcia | 307/140 X |
| 4,751,401 | 6/1988 | Beigel et al. | 307/140 |
| 4,755,691 | 7/1988 | Bethea | 307/140 X |
| 4,766,330 | 8/1988 | Dreier | 307/140 X |

*Primary Examiner*—William M. Shoop, Jr.
*Assistant Examiner*—Paul Ip
*Attorney, Agent, or Firm*—Lowe, Price, LeBlanc, Becker & Shur

[57] ABSTRACT

A limiter switching apparatus includes a control box adapted for being mounted on a machine table with a plurality of terminals and indicators for making electrical connections; and an interface circuit device installed in the control box and electrically connected to the terminals and indicators for effecting switching operations. The interface circuit device is composed of a lower supply circuit for supplying minimal current and voltage therefrom, a first switching circuit connected to the power supply circuit for being actuated to turn on and off, a limiter switch circuit coupled with the first switching circuit and the power supply circuit for controlling the on and off of the first switching circuit, and a second switching circuit with a relay arrangement electrically connected to the power supply circuit and optically coupled with the first switching circuit for effecting relaying operations along with the on and off of the first switching circuit, thereby, safe switching operations with minimal current and voltage can be ensured without incurring electrical leakage from water and oil damage.

4 Claims, 2 Drawing Sheets

LIMITER SWITCHING APPARATUS

BACKGROUND OF THE INVENTION

This invention relates to a limiter switching apparatus, and more particularly to that type of limiter switching apparatus having a circuit arrangement and a unit structure designed for minimizing wire connection and power supply so that prevention of electrical leakage incurred from water and oil is effected accordingly.

Conventional limiter switching apparatus usually require three electrical lines to connect a limiter switch, which is usually installed on a machine unit, and a control device of the limiter switching apparatus, which is always provided in a place away from the limiter switch on the machine unit, for being adapted to a higher power level. These known limiter switching apparatus suffer the following problems:

(1) The electrical lines disposed for meeting the higher power level requirement in the limiter switching apparatus are susceptible to electrical leakage, particularly in bad working conditions where water and oil are unavoidable As a result, short circuiting easily occurs.

(2) In addition to the complicated electrical lines as mentioned above, there is no trouble indicating arrangement provided in the known limiter switching apparatus for being used to indicate the malfunction of an electrical circuit in the control device. Therefore, maintenance and trouble shooting for the limiter switching apparatus are difficult.

SUMMARY OF THE INVENTION

It is accordingly a primary object of this invention to provide a limiter switching apparatus with a novel circuit arrangement by which voltage and current are supplied in a small scale so as to achieve safe operation and prevent electrical leakage. In addition, since only a small voltage and current is supplied from the circuit arrangement, the apparatus can be used in circumstances where water and oil are unavoidable, without causing electrical leakage.

It is another object of this invention to provide a limiter switching apparatus with a plurality of lighting devices by which operational status and trouble conditions can be clearly indicated for facilitating maintenance work.

It is still another object of this invention to provide a limiter switching apparatus with a simplified circuit for which ordinary electrical wires can be used instead of specifically prepared cables so that manufacturing costs are decreased. In addition, with the simplified circuit, maintenance work can be performed on the spot without wasting too much working time and manpower.

These and other objects of the present invention are achieved by providing a limiter switching apparatus which comprises: a control box made up of non-conductive material and provided with a plurality of terminals and indicators installed on a machine table; and an interface circuit device installed in the control box with a plurality of electrical connecting points respectively connected to the terminals of the control box. The interface circuit device includes: a power supply means having a first and a second rectifying circuit disposed therein and coupled with an external power source for supplying minimal current and voltage therefrom; a first switching circuit electrically connected to an output terminal of the first rectifying circuit for being actuated to conduct thereat; a limiter switch fixed in a proper place on the machine table with one end electrically connected to the first switching circuit in the control box and the other end coupled with the first rectifying circuit through a common contact of the machine table for being caused to open and close so as to turn on and off the first switching circuit; and a second switching circuit having a relay arrangement disposed therein electrically connected to the output terminals of the second rectifying circuit and optically coupled with the first switching circuit for being activated to effect relaying operations along with the off and on operations of the first switching circuit; thereby, safety switching operations through a minimal current and voltage can be ensured under any circumstances without incurring electrical leakage due to exposure to water or oil.

Other advantages and characteristics of the present invention will become apparent from the following detailed description of a preferred embodiment when read in conjunction with the accompanying drawings.

DETAILED DESCRIPTION OF THE PREFERRED EMBODIMENT

Figure 1:
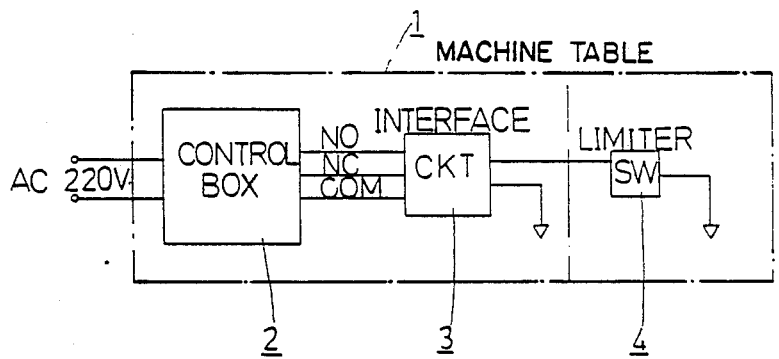
FIG. 1 is a block diagram of a preferred embodiment of a limiter switching apparatus according to this invention.
Figure 2:
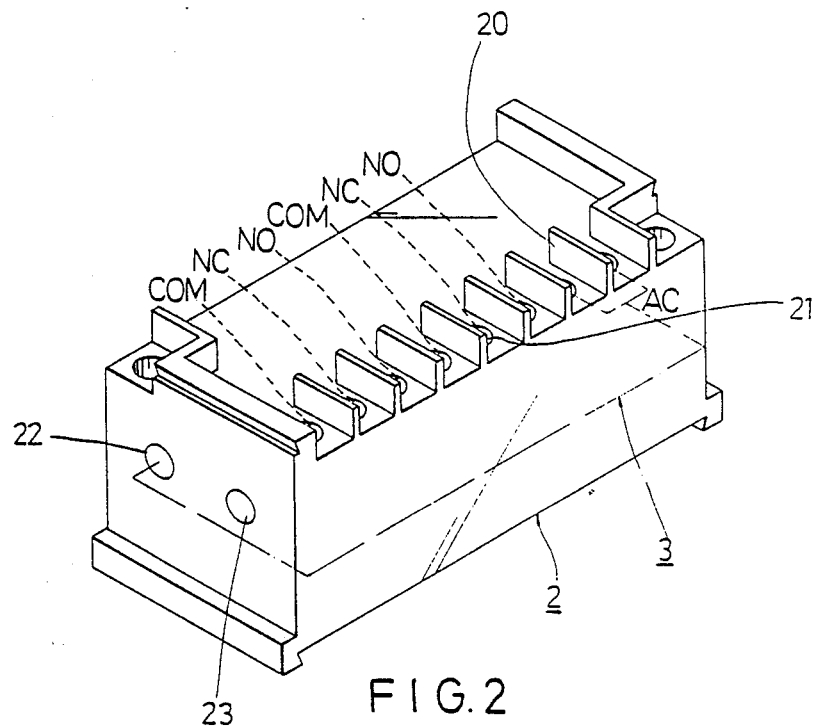
FIG. 2 is a perspective view of a housing unit of the preferred embodiment.

Referring to FIGS. 1 and 2, the preferred embodiment of a limiter switching apparatus according to this invention comprises: a control box 2 adapted to be mounted on a machine table 1; an interfacing circuit device 3 electrically disposed in the control box 2; and a limiter switch 4 fixed at a proper place on the machine table 1 and electrically connected to the interface circuit device 3 through a single electrical line.

Figure 3:
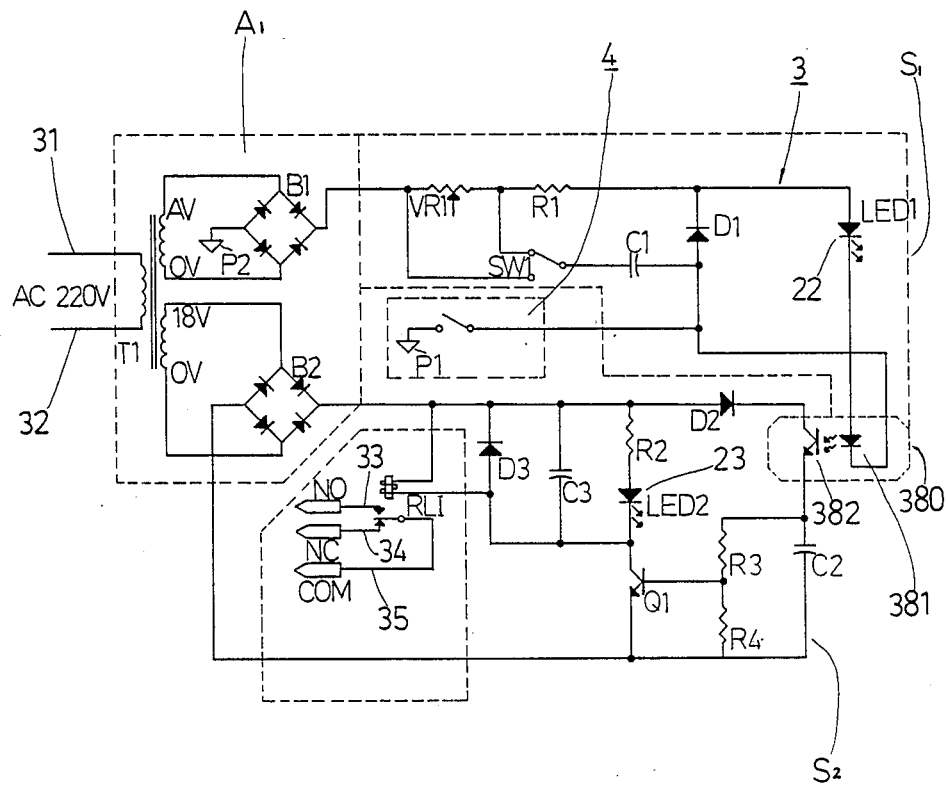
FIG. 3 is a circuit diagram illustrating an electrical connection condition between the interface device and a limiter switch of the preferred embodiment.

As shown in FIG. 2, the control box 2 which is made of non-conductive material includes: a plurality of spacing ribs 20 evenly formed on a top surface thereof; a plurality of electrical terminals 21 separately provided in each area defined by the spacing ribs 20 (there are 8 terminals illustrated in examples in the embodiment) for making internal and external electrical connections therewith; a first indicator 22 and a second indicator 23 separately disposed at one side of the control box 2 for respectively indicating the electrical connection status of the interface circuit device 3 and the limiter switch 4 within the control box 2;

Referring to FIG. 3, the interface circuit device 3 which is an IC board installed in the control box 2 with its electrical connecting points 31, 32, 33, 34, and 35 respectively connected to each internal portion of the terminals 21 with a plurality of electrical contacts NO, NC and COM respectively related to the connecting points 33, 34, and 35 being provided for making external connections through respective terminals 21, comprises: a power supply device A composed of a first rectifying circuit B1 and a second rectifying circuit B2 electrically coupled with an external A.C. power source through a transformer T1 for supplying minimal current and voltage therefrom; a first switching circuit S1, mainly composed of a variable resistor VR1, a switch SW1, a diode circuit D1, and an LED 1, electrically connected to an output terminal of the first rectifying circuit B1; and a second switch circuit S2 composed of a relay circuit RL1, a diode circuit D1, D2, an LED2 and a transistor circuit Q1 electrically coupled with both output terminals of the second rectifying circuit B2; wherein, the first switching circuit S1 and the second switching circuit S2 are coupled together through an optical coupler 380 composed of an LED 381 connected to the first switching circuit S1 and a photo-transistor 382 connected to the second switching circuit S2. As can be seen in the drawing, the limiter switch 4, which is installed at a proper place in the machine table 1, is electrically connected to the diode circuit D1 of the first switching circuit S1 at one end and is directly connected to the machine table 1 at another end through a common contact P1 from which electrical connection can be made through an output common contact P2 of the first rectifying circuit B1. Therefore, only when the limiter switch 4 is caused to close at the machine table 1, can the first switching circuit S1 be turned on to conduct. In this condition, the first indicator 22 (LED1) is lit to indicate that the limiter switch 4 is closed and the switching circuit S1 is turned on. Meanwhile, as the first switching circuit S1 is in conduction, the LED 381 is also lit, causing the photo-transistor 382 to conduct and apply current therefrom to the base of the transistor Q1 which is then turned on to conduct, and the second switching circuit S2 is therefore activated to conduct thereat with the relay circuit RL1 being energized to attract the contact point B1 to be connected to the contact of NO, and the connection status of the NO, NC and COM circuit is therefore changed. It shall be appreciated that the variable resistor VR1 switch SW1 and capacitor C1 in the first switching circuit S1 are used to adjust the delay effect therein so as to prevent the limiter switch 4 from being automatically switched to open.

Once the limiter switch 4 in the machine table 1 is caused to open, the first rectifying circuit B1 is discontinued to perform rectifying operations, and the first switching circuit S1 is thus stopped from conducting and both LED1 and LED 381 are thus turned off. As a result, the optical coupler 380 is cut off, and the photo-resistor 382 is stopped transmitting signals therefrom. In this condition, the bias at the base of the transistor Q1 becomes high, and no current from the second rectifying circuit B2 can flow therefrom, so that the second switching circuit S2 is also turned off with the relay circuit RL1 being deenergized and the contact point B1 being released to recover its contact with the NC contact. At the same time, the second indicator 23 (LED2) is also turned off to indicate the second switching circuit S2 is deactivated along with the discontinuity of the first switching circuit S1. If the first indicator 22 is lit and the second indicator 23 is not, it can be clearly seen that a malfunction of the second switching circuit S2 has occurred, and the trouble can be easily located therein and quick repairs made. Moreover, since both switching circuits S1 and S2 are operated with a minimal quantity of current (about 10mA–15mA) and voltage, the preferred embodiment can be used in a place where water and oil are unavoidable without incuring electrical leakage.

It shall be appreciated that the common contact P1 of the limiter switch 4 is the metal surface of machine table 1 while the common contact P2 of the first rectifying circuit B1 is a metal layer (not shown) electroplated on the surface of control box 2 and positioned nearby on the metal surface of the machine table 1. Therefore, only a single electrical line is required to make the electrical connection between the limiter switch 4 and the interface circuit device 3. This simplified external wiring of the switching apparatus not only decreases the assembly work but also increases the preventive effect from water and oil damage.

While a preferred embodiment has been shown and described, it should be understood that it is not the intention to limit the invention to the particular form disclosed; on the contrary, the invention is to cover all modifications, equivalences and alternative constructions falling within the scope of the present invention as expressed in the appended claims.

What I claim is:

1. A limiter switching apparatus comprising:
   a control box made of non-conductive material and adapted for being installed on a metal surface of a machine table;
   a plurality of spacing members evenly formed on a top surface of said control box;
   a plurality of electrical terminals respectively provided at each area defined by said spacing members for making internal and external electrical connections therewith;
   an interface circuit means designed for being operated with minimal current and voltage to prevent electrical leakage and electrically disposed in said control box with electrical connection points respectively connected to each one of said electrical terminals of the control box for effecting electrical connections and disconnections therewith; and
   a limiter switch installed at a proper place on the machine table and electrically connected to said interface circuit means through a single electrical line and a common contact of the machine table for being caused to close and open so as to activate and deactivate said interface circuit means; thereby, switching operations of said interface circuit device can be effectively performed within said control box in any conditions without incurring electrical leakage.

2. A limiter switching apparatus according to claim 1 wherein said control box further comprises a metal layer electroplated on a surface of the control box for being closely positioned on the machine table and serving as a common contact thereat in connection with the common contact of said limiter switch.

3. A limiter switching apparatus according to claim 1 wherein said interface circuit means comprises:
   a power supply means composed of a first and a second rectifying circuit coupled with an external power source for supplying minimal current and voltage therefrom;
   a first switching circuit means composed of a variable resistor, a switch and a first LED electrically connected to an output terminal of said first rectifying circuit for being actuated to keep on electrical conduction therefrom;
   a limiter switch circuit having one end connected to said first switching circuit and the other end coupled with said first rectifying circuit through a common contact for being activated to effect off-and-on conditions of said first switching circuit means; and
   a second switching circuit means having a second LED, a transistor circuit and a relay circuit disposed therein electrically coupled with both output terminals of said second rectifying circuit for being actuated to effect relaying operations along with the on-and-off conditions of said first switching circuit means;

wherein said first and second switching circuit means are electrically coupled together through an optical coupler of which an LED is connected to said first switching circuit means and a photo-transistor is coupled with said second switching circuit means so that said second switching circuit means will not be turned on until said first switching circuit means is actuated to conduct thereat.

4. A limiter switching apparatus according to claim 1 wherein said control box further comprises an electroplated metal layer on an outer surface of said control box for serving as a common contact by being closely positioned on a metal surface of the machine table.

* * * * *